United States Patent [19]

Ong et al.

[11] Patent Number: 5,157,282
[45] Date of Patent: Oct. 20, 1992

[54] PROGRAMMABLE OUTPUT DRIVER FOR INTEGRATED CIRCUITS

[75] Inventors: Randy T. Ong, Cupertino; Suresh M. Menon, Sunnyvale; Hang Kwan, San Bruno, all of Calif.

[73] Assignee: Cypress Semiconductor Corporation, San Jose, Calif.

[21] Appl. No.: 682,571

[22] Filed: Apr. 8, 1991

[51] Int. Cl.[5] ............................................ H03K 17/16
[52] U.S. Cl. ...................................... 307/443; 307/445; 307/449
[58] Field of Search ................. 307/443, 445, 449, 463

[56] References Cited

U.S. PATENT DOCUMENTS

| | | | |
|---|---|---|---|
| 4,758,743 | 7/1988 | Dehganpour et al. | 307/443 |
| 4,948,991 | 8/1990 | Schucker et al. | 307/443 |
| 5,045,722 | 9/1991 | Yang et al. | 307/443 |
| 5,051,625 | 9/1991 | Ikeda et al. | 307/443 |

OTHER PUBLICATIONS

Sweha, S., et al., "A 29ns 8Mb EPROM with Dual Reference-Column ATD Sensing" IEEE International Solid-State Circuits Conference Digest of Technical Papers, pp. 264-265, Feb. 15, 1991.

Primary Examiner—Eugene R. LaRoche
Assistant Examiner—R. A. Ratliff
Attorney, Agent, or Firm—Roger S. Borovoy

[57] ABSTRACT

The present invention minimizes the noise voltage associated with the switching of output driver transistors of integrated cicruits caused by the rapid change in value of the current, expressed by the term di/dt, from the load into the driver transistors through the package leads. The present invention uses a programmable coarse current control (CCC) circuit and a programmable fine current control (FCC) circuit that control the pull-down output transistors. The FCC creates two time periods, after which it prevents the CCC from controlling an output pull-down transistor. The FCC and the CCC are used to reduce the di/dt dependent voltage noise by controlling the slope and the shape of the output voltage pull-down characteristics.

11 Claims, 6 Drawing Sheets

PROGRAMMABLE OUTPUT DRIVER FOR INTEGRATED CIRCUITS

BACKGROUND OF THE INVENTION

The present invention relates to semiconductor integrated circuits and more particularly to an improved output driver buffer circuit that has field programmable switching delay time of the signal at the output pad of the integrated circuit.

DESCRIPTION OF THE RELEVANT ART

It is well known in the art that the propagation delay time through an integrated circuit (IC) includes the delay from the input leads of the package to the input pads of the chip, the propagation or processing delay through the chip and the propagation delay from the output of the chip to the output leads of the package.

The general trend in the semiconductor industry has been to decrease the delay from the input leads to the output leads of an integrated circuit by reducing the geometrical dimensions of the MOS or bipolar transistors on the chip, thereby increasing the propagation speed through each transistor, which translates into overall speed improvement of the chip. However, the IC industry arrived at the point where the propagation delay through the chip is as short as the propagation delay through the output leads. The main reason is that the load connected to each output lead of the IC has not changed because the load is a function of the printed circuit board design that incorporates the IC.

Generally an IC manufacturer specifies the total IC propagation time for a specified maximum load per lead, and provides for current-sink and current-source capabilities of the output buffer within the chip that drives a given load. However in most applications, the load on the output lead of the IC is lower than the maximum load specified by the manufacturer, which creates a mismatch that causes excessive power consumption by the output buffer. This mismatch also brings about uncontrolled and excessive current spikes caused by the uncontrolled switching rate of the output driver. When this excessive current flows through the inductance of the IC package leads, it causes noise which interferes with the operation of the system and causes additional delay.

In the prior art this noise and mismatch between load and output driver were tolerated since the output switching time constituted only a small portion of the total system delay time. The system designer merely allotted system recovery time for output switching. However semiconductor technology has advanced to a point where in many applications, the chip delay is as long as the delay caused by switching the output load.

Most users of integrated circuits can do little to remedy these problems outside the IC. Yet this uncontrolled switching may cause a system malfunction. This is especially true in a registered output programmable logic device where unchanged logic state may look as if it was changed.

It is an object of the present invention to minimize the load mismatch to the sink and source current capabilities of a given output buffer.

Another object of the invention is to provide a means for electrically controlling the switching rate of an output buffer.

SUMMARY OF THE INVENTION

The present invention minimizes the noise voltage associated with the switching of output driver transistors of integrated circuits caused by a rapid change in current, expressed by the term di/dt, from the load into the IC output driver transistors through the package leads. The present invention uses a programmable coarse current control (CCC) circuit and a programmable fine current control (FCC) circuit that together control the pull-down output transistors. The FCC creates two time periods after which it prevents the CCC from controlling an output pulldown transistor.

The programmable output buffer of the invention includes a pull-up circuit and a pull-down circuit, the pull-up and the pull-down circuits having a common input line and a common output line, a fine current control means included in the pull-down circuit and connected between the common input line and the common output line and a coarse current control means included in the pull-down circuit and connected between the common input line and the common output line, whereby signal transitions on the common input line cause transitions on the common output line with controllable slope and shape.

The CCC is programmed by controlling the current through the branches of a darlington circuit. The FCC is programmed by controlling the current from the $V_{CC}$ rail of inverters using a network of pass transistors.

The output buffer circuit of the present invention also includes a pull-up darlington circuit that drives the output load.

The programming of the CCC and the FCC is done by storing data in a storage means, such as memory cells containing fuses.

The FCC and the CCC are used to reduce the di/dt dependent voltage noise by controlling the slope and the shape of the output voltage pull-down characteristics. This allows a fast output switching delay to be programmed for use with a low inductance package such as a PLCC for delay reduction, and a slow output switching delay is allowed to be programmed for use with a high inductance package such as a DIP for ground noise reduction.

BRIEF DESCRIPTION OF THE DRAWINGS

A complete understanding of the present invention and other advantages and features thereof may be gained from a consideration of the following description of the preferred embodiment taken in conjunction with the accompanying drawings in which.

DETAILED DESCRIPTION OF THE INVENTION

Figure 1:
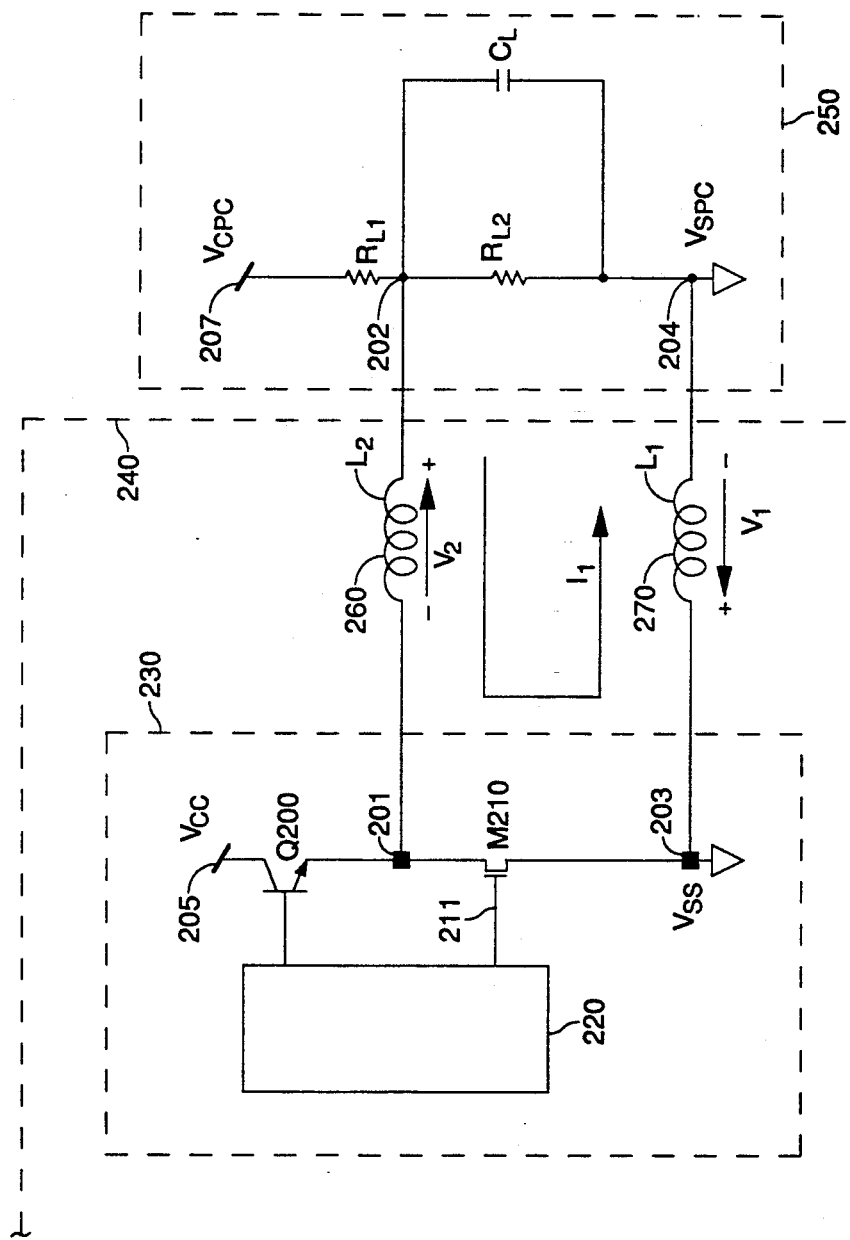
FIG. 1 is a block diagram and partially schematic circuit diagram of a prior art connection of an output buffer of a chip to a load on a printed circuit board.

While the present invention is susceptible of various modifications and alternative constructions, the embodiments shown in the drawings will be described in detail.

FIG. 1 depicts the schematic circuit diagram and a block diagram of a prior art connection of an output buffer of chip 230 to load 250 on a printed circuit board. The integrated circuit package is indicated as 240.

The load 250 includes resistor RL1 connected between $V_{CPC}$ (at node 207) and node 202; resistor RL2 connected between node 202 and printed circuit board (PC board) ground $V_{SPC}$ at node 204; and capacitor CL also connected between node 202 and PC board ground $V_{SPC}$.

Chip 230 may include a plurality of input pads which are not shown for the sake of clarity, a plurality of output pads of which only one is indicated at 201, a ground $V_{SS}$ pad 203 and a $V_{CC}$ pad 205. Chip 230 may also include other functional blocks which are not shown such as storage elements, computational elements and programmable elements. The only element of chip 230 indicated is one output buffer that includes output control block 220, its output bipolar pull-up transistor Q200 and output NMOS pull-down transistor M210.

Output pad 201 is connected to the load node 202 by package lead 260, which has a parasitic indicated by inductance L2, and to $V_{SS}$ pad 203, which is connected to PC board ground node 204 by package lead 270, which has a parasitic inductance indicated by L1.

During output transition from a high to a low logical state, Q200 turns off and M210 turns on to conduct the load sink current I1. This causes output pad 201 to transition to approximately $V_{SS}$ level, which is ideally the 0 volts provided by PC board ground at node 204. However due to the parasitic inductance L1 of package lead 270, typically about 10 nanohenries, a noise voltage (which later will be called Vx) develops due to I1 which increases $V_{SS}$ on the chip above ground temporarily to $V_1$, and the load node 202 to $V_N$ above ground temporarily, thus causing a delay in switching output load node 201 to ground. I1 is made up of two components: I1AC, the transient current contributed by the reactive components in the load CL, which goes to 0 milliamps once CL is discharged; and I1DC, the DC current contributed by the passive components in load resistor RL1. Resistor RL2 does not contribute to I1 when output load node 202 is pulled down because that node is already connected to ground.

The noise voltages $V_N$, $V_1$ and $V_2$ are quantitatively described below by Eq. 1, Eq. 2 and Eq. 3 as follows.

$$V_N = V_1 + V_2 \qquad \text{Eq 1}$$

$$V_1 = -L1(dI1AC/dt) - L1(dI1DC/dt) \qquad \text{Eq. 2}$$

$$V_2 = -L2)dI1AC/dt) - L2(dI1DC/dt) \qquad \text{Eq. 3}$$

As Eqs. 1 to 3 imply, $V_N$ exists only during current transitions of one output and its magnitude increases if transitions occur within a shorter time.

Figure 2:
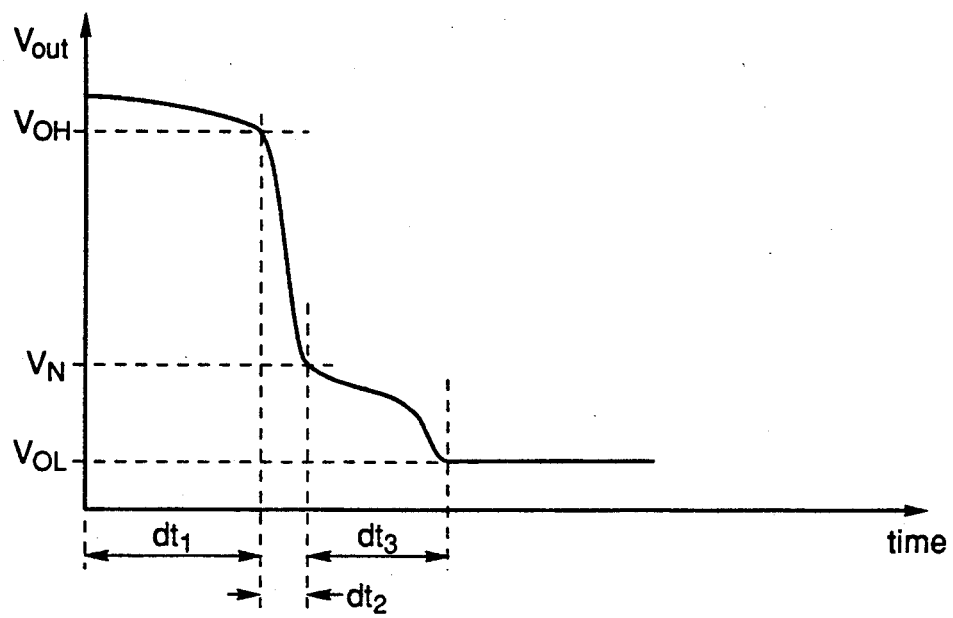
FIG. 2 is an output voltage response curve of prior art output buffers.
Figure 3:
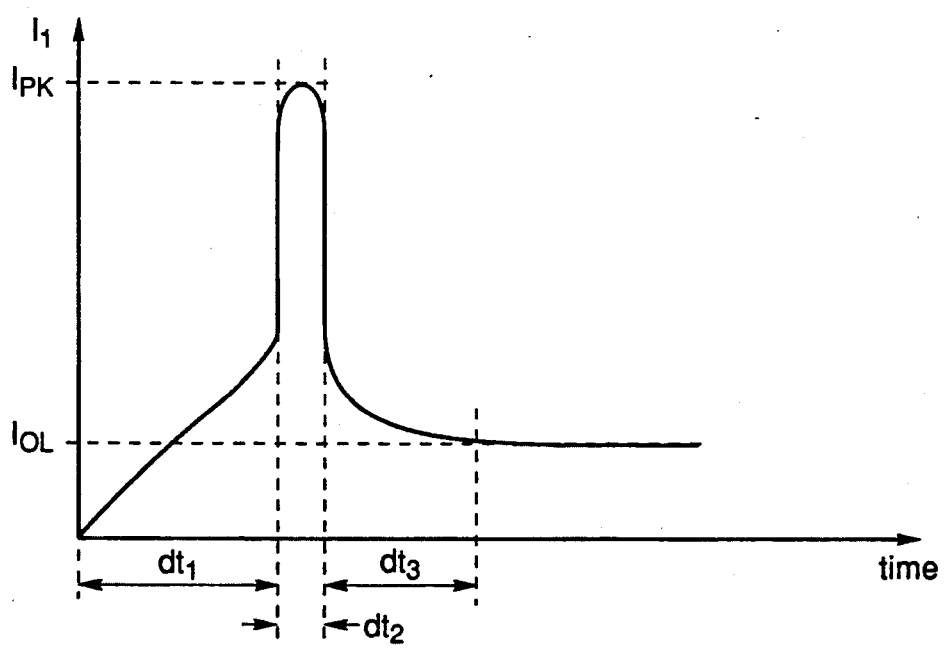
FIG. 3 is an output current response curve of prior art output buffers.

FIG. 2 illustrates the transition of the output voltage $V_{OUT}$ at load node 202 as a function of time. Reference will be made to FIGS. 1 and 2. As can be seen, the transition is divided into three time periods dt1, dt2 and dt3. As shown in FIG. 3, during dt1, pull-down transistor M210 conducts some I1 current from the load, which is below the maximum conduction capability of transistor M210 because its gate 211 is still in transition from 0 volts to $V_{CC}$, typically 5 volts. Once M210 is fully turned on between dt1 and dt2, a large surge of I1 current is drawn by M210. In response to that current I1, parasitic inductors L1 and L2 develop voltages $V_1$ and $V_2$, respectively, between dt2 and dt3, which, when added in series, make up $V_N$. As a result, even if the drain-source voltage of M210 is 0 volts, the output voltage $V_{OUT}$ at load node 202 will be $V_N$. Noise voltage $V_N$ diminishes after a short period between dt2 and dt3 as a result of the energy lost in inductors L1 and L2. Meanwhile, a delay results in pulling down output node 202 to a predefined logical level $V_{OL}$. Once M210 discharges capacitor CL, after time period dt3, $V_{OUT}$ settles at or below $V_{OL}$. After dt3, I1 has the DC component I1DC of Eq. 4.

$$I1DC = (V_{CC} - V_{DS})/RL1 \qquad \text{Eq. 4}$$

Here, I1DC flowing through RL1 and $V_{DS}$ results in drain-source voltage of M210 of about 0.15 volts at these bias conditions.

Figure 4:
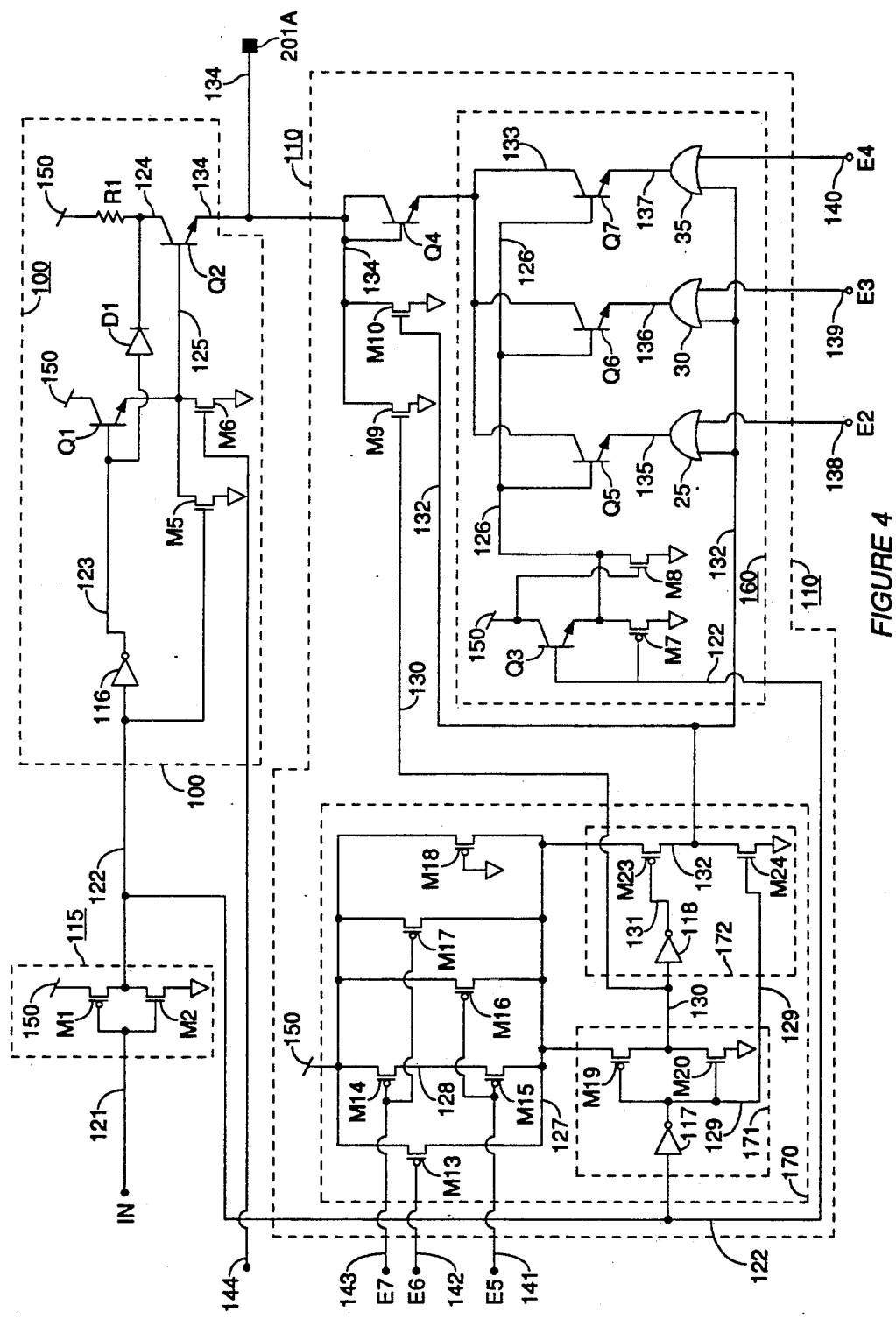
FIG. 4 is a circuit diagram of the output buffer of the present invention.

The output buffer of the present invention shown in FIG. 4 is divided into two portions. The first portion is the pull-up circuit 100 and the second portion is the pull-down circuit 110. The inputs of both circuits 100 and 110 is received on line 122 from inverter 115, which in turn receives its input at node IN connected through inverter 115 to line 121. CMOS inverter 115 consists of PMOS transistor M1 and NMOS transistor M2. $V_{CC}$ rail 150 provides power to the source of M1 and the $V_{SS}$ rail 151 provides 0 volts to the source of transistor M2. This inverter circuit configuration will be referred to as a CMOS inverter.

Pull-up circuit 100 consists of CMOS inverter 116, diode D1, resistor R1 (which may be polysilicon), bipolar transistors Q1 and Q2 and NMOS transistors M5 and M6. Transistors Q1 and Q2 are connected in a darlington formation. The gate of transistor M6 receives a reference voltage $V_{RN}$ on line 144 to force a small bias current through transistor Q1 when output line 134 is high, thereby using M6 as a current source. All bipolar transistors used in this embodiment of the invention are of NPN type.

Pull-down circuit 110 includes two major blocks. The first major block is a fine current control block 170 (below referred to as FCC block 170); the second block is the coarse current control block 160 (below referred to as CCC block 160) Pull-down circuit 110 also includes load pull-down NMOS transistors M9 and M10 and bipolar transistor Q4.

The FCC block 170 within pull-down circuit 110 consists of a pass transistor network of PMOS transistors M13, M14, M15, M16, M17 and M18, CMOS inverters 117 and 118, PMOS transistors M19 and M23 and NMOS transistors M20 and M24. FCC block 170 is controlled by three control inputs E5, E6 and E7 through lines 141, 142 and 143, respectively.

CMOS inverter 117 and transistors M19 and M20 make up a first delay generator for a time period dt1. CMOS inverter 118 and transistors M23 and M24 make up a second delay generator for a time period dt2, as will be detailed below.

CCC block 160 includes bipolar transistors Q3, Q5, Q6 and Q7, CMOS OR-gates 25, 30 and 35, NMOS transistor M8 and PMOS transistor M7. Bipolar transistors Q3, Q5, Q6 and Q7 are connected in a multiple branch darlington configuration, where transistor Q4 is connected in a diode formation with its base shorted to its collector and both connected to output pad 201A by line 134. This darlington circuit will be explained in detail below.

OR-gates 25, 30 and 35 control the current flow through the three branches of the pull-down darlington. NMOS transistor M8 is a small leaker transistor that discharges line 126 to $V_{SS}$ in the event that the pull-down darlington branches are not conducting current. PMOS transistor M7 is a pull-down transistor which turns off when bipolar transistor Q3 turns on, but when Q3 is off, transistor M7 discharges the voltage on line 126 to one PMOS threshold voltage above $V_{SS}$. Control inputs E2, E3 and E4 on lines 138, 139 and 140, respectively, are used to control the number, between zero and three, of pull-down darlington branches that conduct current.

Figure 5:
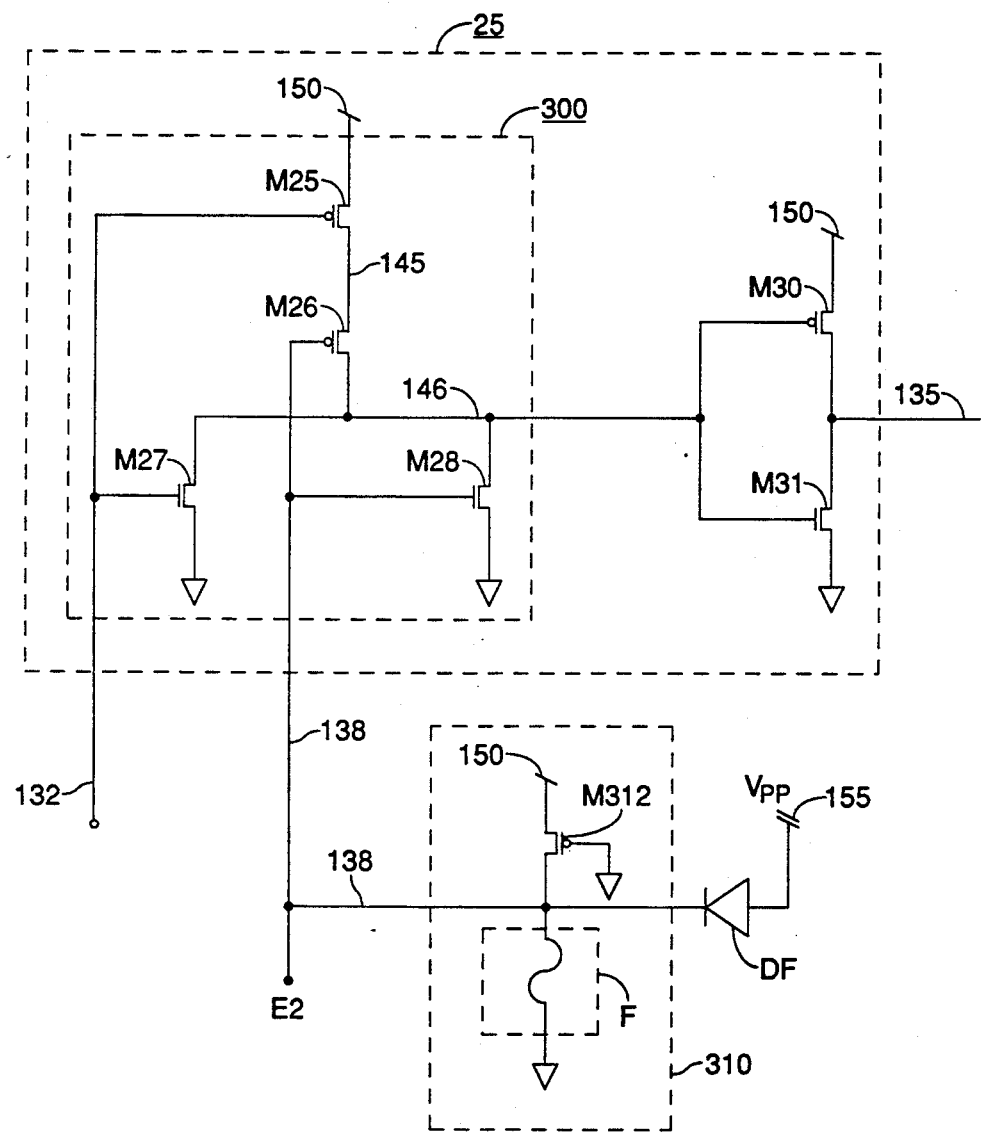
FIG. 5 is a circuit diagram of an OR-gate with the fuse programmable input of the present invention.

FIG. 5 illustrates the circuit of OR-gate 25 which is also similar to the circuit of OR-gate 30 and OR-gate 35. In FIG. 5, NOR-gate 300 includes PMOS transistors M25 and M26 and NMOS transistors M27 and M28, as is well known in the art. The inputs of NOR-gate 300 are the same as the inputs of OR-gate 25. The output of NOR-gate 300 on line 146 is inverted by CMOS inverter 152 made up of PMOS transistor M30 and NMOS transistor M31 and outputted at line 135 as the output of OR-gate 25.

The electrical operation of the output buffer of this invention will be described now in reference to FIGS. 4 and 5. The explanation below will refer first to pull-up block 100, then to CCC block 160 and finally to FCC block 170 of pull-down circuit 110.

In order to demonstrate the benefits gained by the present invention, the voltage level at the output pad 201A will be assumed to be 5 volts, or a "1" logic level, for a long time and that it was induced in response to a "1" logic level at input line 121.

Upon a transition of input signal IN at line 121 from a "1" to a "0", inverter 115 will bring line 122 to "1", turning on M5 to pull-down line 125 to ground. A "1" on line 122 will also invert CMOS inverter 116 to bring line 123 to a "0" logic level, thereby turning Q1 and diode D1 off. Q1 turns off because its $V_{BE}$ is below the 0.7 volts value required to have an NPN transistor conducting current; diode D1 turns off because its cathode is biased by R1 to near $V_{CC}$ and its anode is brought to 0 volts by inverter 116, thereby reverse biasing it. At this point, because line 125 is no longer charged by Q1 and is discharged by M5 and M6 to 0 volts, transistor Q2 will turn off because its $V_{BE}$ is below 0.7 volts (or may even be negative if the pull-down circuitry 110 did not switch fast enough to pull-down output line 134 to ground). The gate of transistor M6 receives a reference voltage $V_{RN}$ on line 144 in order to provide a bias current for Q1 when line 123 is at a "1" level.

The role of resistor R1 is to limit the current flow from $V_{CC}$ rail 150 through Q2 to output pad 201A in case there is a shorted load circuit connected accidentally between pad 201A and ground, which may cause physical damage to Q2 and wiring lines 124 and 134 when line 125 is at a "1".

Bipolar transistors Q1 and Q2 are connected in a darlington formation to achieve maximum gain during the pull-up of output line 134 when line 125 goes to "1".

The electrical operation of the coarse current control block 160 will now be described. Upon transition of input signal IN at line 121 from a "1" to a "0", inverter 115 will bring line 122 to "1", turning PMOS transistor M7 off and turning Q3 on to pull-up line 126 to a "1" logic level which equates to a voltage level of $V_{CC}-V_{BE}$, where $V_{BE}$ is about 0.7 volts. Because Q3, Q5, Q6 and Q7 are connected in a darlington circuit configuration, Q5, Q6 and Q7 turn on very rapidly and will conduct at their maximum current drive capability if the output of OR-gates 25, 30 and 35 are at a "0" logic level. The pull-down transistors in OR-gate 25, 30 and 35, for example M31 in FIG. 5, are designed to have large current drive capability in order not to limit the current flow through their series bipolar transistors Q5, Q6 and Q7 respectively. The only limit on the current drive of Q5, Q6 and Q7 is determined by the design of their physical size and the physical size of Q3 and of M31 of FIG. 5. NMOS transistor M8 has its gate connected to $V_{CC}$ and its drain to line 126. M8 has a very small physical size and is used as a leaker transistor in order to discharge line 126 to $V_{SS}$ which is below $V_{BE}$, thereby biasing the bases of Q5, Q6 and Q7 to 0 volts and thus turning them off when line 122 transitions from a "1" to a "0" logic level.

Control inputs E2, E3 and E4 may be used to program the amount of the pull-down current flow through Q4 from output pad 201A in order to comply with a specific application of a chip which uses the output buffer of FIG. 4. Also FCC output line 132, which is the second input to OR-gates 25, 30 and 35 is held at a "0" logic state for a period of dt1+dt2 after a transition of input signal IN on line 121. As will be explained below, the periods dt1 and dt2 are programmable by FCC block 170.

The programming of control inputs E2, E3 and E4 use binary logic of one of eight logical states from "000" to "111", as is known in the art. The 000 state corresponds to Q5, Q6 and Q7 being off with not current flowing through Q4; the 111 state corresponds to Q5, Q6 and Q7 being on with maximum current flowing through Q4.

In one embodiment the programing of E2, E3 and E4 is accomplished by electrically blowing fuses, anti-fuses or electrically programmable non-volatile memory cells, such as EEPROMs.

FIG. 5 shows an implementation of programming the logical state of input E2 by means of a fuse F. Storage cell 310 includes fuse F that has a very low resistance of about 60 ohms before it is blown, and may be made of titanium-tungsten (TiW), PMOS transistor M312 has a very long channel length and a very narrow channel width. Transistor M312 has its drain connected to line 138, its source connected to $V_{CC}$ rail 150 and its gate connects to $V_{SS}$. The output of cell 310 is storage line 138 which is also the input E2 of OR-gate 25. Fuse F is connected between $V_{SS}$ ground rail and storage line 138. Diode DF is connected with its cathode to storage line 138 and with its anode to high voltage test $V_{PP}$ point 155. A high voltage of about 10 volts is applied during configuration of the chip to $V_{PP}$ point 155. However, during normal operation of the chip, $V_{PP}$ 155 is biased at 0 volts.

Immediately after fabrication of a chip which incorporates the output buffer of FIG. 4, fuse F of FIG. 5 remains intact and the voltage of control input E2 on line 138 is close to 0 volts, corresponding to a "0" state. Since all control inputs E2, E3 and E4 (only E2 is shown in FIG. 5) have a similar circuit and storage cell 310, all OR-gates 25, 30 and 35 will be programmed to have a "0" logic state at their output and will enable Q4 to conduct maximum current through Q5, Q6 and Q7. However if a particular control input, for example E2, is preferred to have "1" logic state in order to reduce the current flow through Q4, then fuse F will be blown to be non-conductive and line 138 will be pulled up to the 5 volts of the $V_{CC}$ rail 150 by M312. Fuse F is blown by taking $V_{PP}$ point 155 to 10 volts so that current flows through diode DF and fuse F to ground. Once fuse F is blown, $V_{PP}$ point 155 is brought back to 0 volts, but line 138 does not discharge to below 5 volts, or a "1" logic state because diode DF is reverse biased and does not conduct. Leaving fuse F intact or blowing it constitutes programming a "0" or a "1" respectively, into storage cell 310.

Although the storage cell 310 of FIG. 5 uses a fuse, other storage cell elements may be used. Such storage elements may be latches or flip-flops that are connected individually to each control input E2–E4 or in a chain of a shift register whose parallel outputs are applied to the E2–E4 control inputs of CCC block 160. Alternatively fuse F may be blown by means of a laser beam, as is known in the art, or fuse F may be substituted by the present or absence of a metal conductor that may be deposited and etched during the manufacturing of the chip.

The electrical operation of fine current control (FCC) block 170 will now be explained in reference to FIG. 4. FCC block 170 within pull-down circuit 110 has one input on line 122 which carries the logical complement of the buffer input IN on line 121. FCC block 170 has two outputs, the first output on line 130 that is connected to the gate of output pull-down transistor M9; the second output is on line 132 that connects to the gate of output pull-down transistor M10 and also to the inputs of OR-gates 25, 30 and 35 of CCC block 160.

FCC block 170 is essentially a delay stage made up of four inverters connected in series to delay the logical complement on line 122 of the buffer input signal IN on line 121, and present them at the output lines 130 and 132 so as to manage the pulldown current conduction of the output pull-down transistors M9, M10 and Q4.

The four inverters are the following: the first is CMOS inverter 117 that receives the input 122 and whose output drives line 129. The second is the combination of PMOS transistor M19 and NMOS transistor M20. M20 has its source connected to $V_{SS}$ rail and its drain connected to the inverter output line 130. M19 has its drain connected to output line 130 and its source connected to line 127 which, through a matrix of PMOS transistors M13–M18, is connected to $V_{Cc}$ rail 150 As will be explained below, control inputs E5, E6 and E7 are used for programming the drain current of M19. The third inverter is CMOS inverter 118 that takes its input from line 130 and its output drives line 131. The fourth inverter includes pull-down NMOS transistor M24 and pull-up PMOS transistor M23. The gate of M24 is connected to line 129 which is the output of the first inverter 117. The source of M24 is connected to $V_{SS}$ and its drain is connected to the output of the inverter which is line 132. The gate of M23 is connected to the output of the third inverter on line 131. The drain of M23 is connected to the output of the third inverter on line 132. The source of PMOS transistor M23 is connected to line which also is connected to the PMOS pass transistors matrix M13–M18, and its drain current is controlled in the same way that E5, E6 and E7 control the drain current of M19 of the second inverter, as will be explained below.

In the pass transistor network of PMOS transistors M13–M18, the source and drain terminals of M13, M16, M17 and M18 are connected to $V_{CC}$ rail 150 and line 127 respectively. M14 and M15 are thus connected in series between $V_{CC}$ rail 150 and line 127. The gate of M13 is connected to $V_{CC}$ control input E6 by line 142. The gates of M14 and M17 ar connected to control input E7 by line 143. The gates of M15 and M16 are connected to control input E5 by line 141. The gate of M18 is connected to $V_{SS}$. The connection of the gate of M18 to $V_{SS}$ guarantees that the sources of M19 and M23 will receive current flow from $V_{CC}$ independently of the control inputs E5, E6 and E7, thereby allowing the fourinverter chain between line 122 and line 132 to operate properly with a full swing between a logic "1" and a logic "0" state at their outputs even if M13–M17 are off.

The control inputs E5, E6 and E7 to FCC block 170 are programmed using a storage cell in the same way that E2, E3 and E4 were programmed in control CCC block 160. Here also, E5, E6 and E7 may be programmed to one of eight logical states from 000 to 111. Lines 141, 142 and 143 are in fact storage lines of storage cells similar to storage cell 310 of FIG. 5. Logical state 111 means that the gates of M13, M14, M15, M16 and M17 are high, that these transistors are off and the only pass of $V_{CC}$ to line 127 is through M18. This means that M19 and M23 receive minimum current drive and so they cause the longest delay, meaning that dt1 +dt2 will be the longest. Logical state 000 means that the gates of M13, M14, M15, M16 and M17 are low and that these transistors are on. This means that M19 and M23 receive maximum current drive and thus cause the shortest delay, or dt1 +dt2 will be the shortest.

The electrical effect of the outputs of FCC block 170 and CCC block 160 on the pull-down characteristics of load 250A of FIG. 8 on pad 201A by output NMOS pull-down transistors M9 and M10 and bipolar transistor Q4 will now be described with reference to FIGS. 6, 7 and 8.

Figure 6:
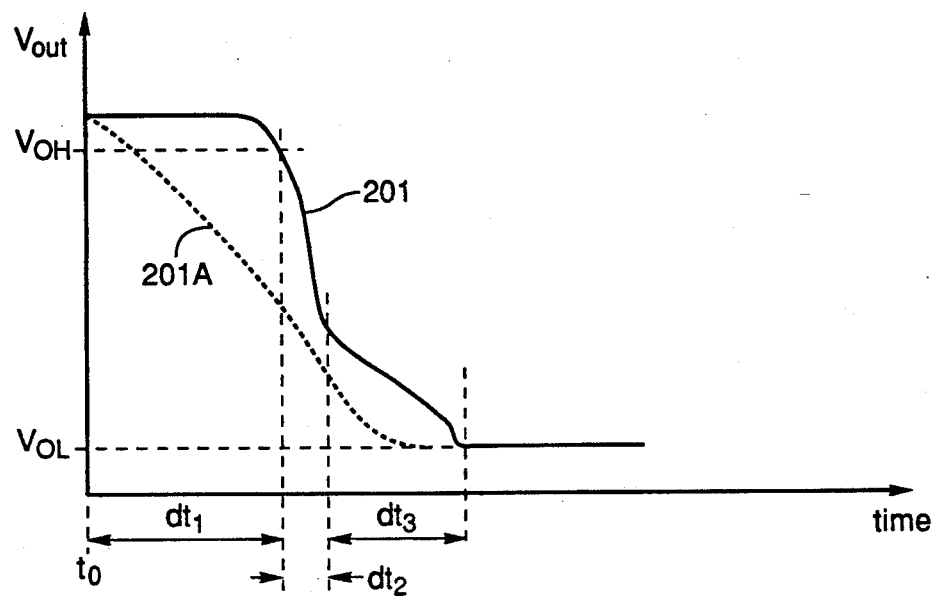
FIG. 6 is an output voltage response curve of the present invention superimposed on an output voltage response curve of prior art output buffers.
Figure 8:
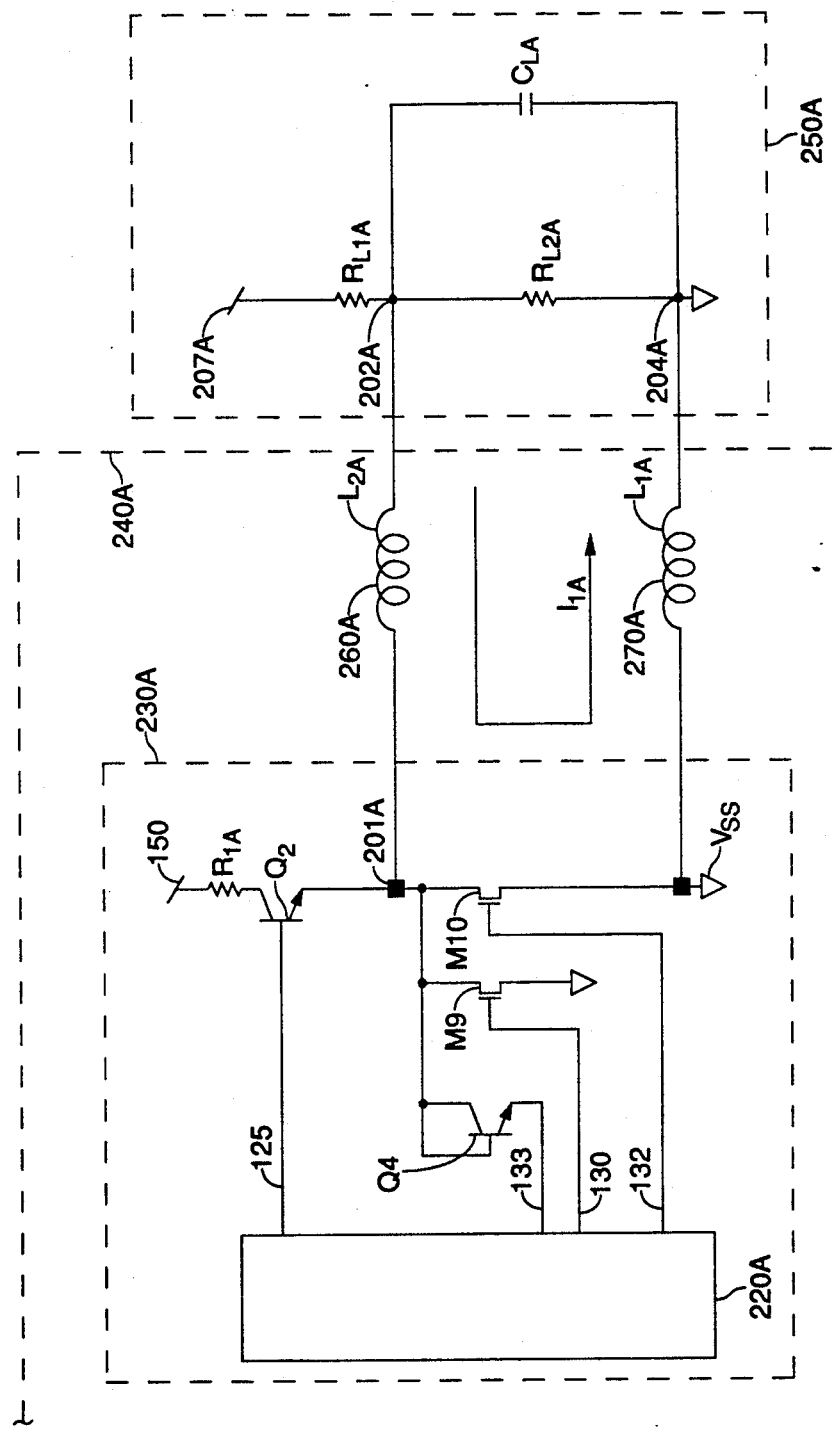
FIG. 8 is a block diagram and partially schematic circuit diagram of the output buffer of the present invention incorporated in a chip and connected to a load on a printed circuit board.

FIG. 6 illustrates the transition of the output voltage $V_{OUT}$ at load node 202A of FIG. 8 as a function of time. This transition is compared to $V_{OUT}$ of node 202 resulting from the prior art circuit of FIG. 1. As can be seen, the transition is divided into three time periods dt1, dt2 and dt3.

Referring to FIGS. 4 and 6, upon switching of input signal IN on line 121 from a "1" to a "0", the internal node 122 switches from "0" to "1" with sufficient current drive at the output CMOS inverter 115 to drive the respective inputs of pullup block 100 (at the input of CMOS inverter 116), FCC block 170 (at the input of CMOS inverter 117) and CCC block 160 (at the input of the inverter of Q3 and M7) at time t0, the time at which dt1 starts and Q2 is turned off so as not to allow current flow from $V_{CC}$ to the emitter of Q2. The emitter of pull-down bipolar transistor Q4 starts conducting with the maximum current allowed by the programmed value of the emitter currents of Q5, Q6 and Q7 through the pull-down NMOS transistors (M31 in FIG. 5) of ORgates 25, 30 and 35 respectively, thereby discharging the load on output node 202A and reducing its voltage faster than was possible using prior art techniques, such as discharging node 202 of FIG. 1. The sink current produced at the beginning of dt1 is higher than the sink current produced by prior art circuits during the same period of dt1, but it results in a smaller value for the di/dt term of Eqs. 2 and 3, which means a small noise voltage $V_N$ is produced by the parasitic inductors L1 and L2 of the package leads 270 and 260.

After the period dt1, the output CMOS of inverter 117 on line 129 goes from a "1" to a "0" and the output of the M19/M20 inverter goes from a "0" to a "1" on line 130. These voltage conditions turn on output NMOS transistor M9 and start period dt2 in which both M9 and Q4 are conducting at a high current unless the CCC block 160 is programmed by control inputs E2, E3 and E4 not to conduct current through its OR-gates 25, 30 and 35.

After the period dt2, the output of CMOS inverter 118 on line 131 goes from a "1" to a "0", thereby turning PMOS transistor M23 on and pulling line 132 from a "0" to a "1", starting period dt3. When line 132 is at a "1" logic state, the outputs of OR-gates 25, 30 and 35 also go to a "1" independently of the programmed state of control inputs E2, E3 and E4, thereby preventing current flow through Q5, Q6 and Q7 and Q4. At the same time, output NMOS transistor M10 is turned on, since its gate is also connected to line 132, thereby leaving only NMOS transistors M9 and M10 pulling down output node 201A.

The pull-up speed of line 130 to $V_{CC}$ by M19 determines the duration of dt2. Therefore dt2 is programmable by programming the value of the source current of M19 by means of control inputs E5, E6 and E7, as was mentioned above. For a shortest dt2, M19 needs maximum current drive and this means that the gates of M13, M14, M15, M16 and M17 must be connected to a "0", such as to $V_{SS}$. For a longest dt2, M19 needs minimum current drive. This means that the gates of M13, M14, M15, M16 and M17 must be connected to a "1", such as $V_{CC}$, leaving only M18 conducting small current.

The pull-up speed of line 132 to $V_{CC}$ through transistor M23 determines the duration of dt3. Since the source of M23 is connected to the source of M19 through line 127, the programming of control lines E5, E6 and E7 affects the source current of M23 in the same way as it affects the source current of M19. When M19 has weak source current, so does M23. When M19 has a strong source current, so does M23.

Figure 7:
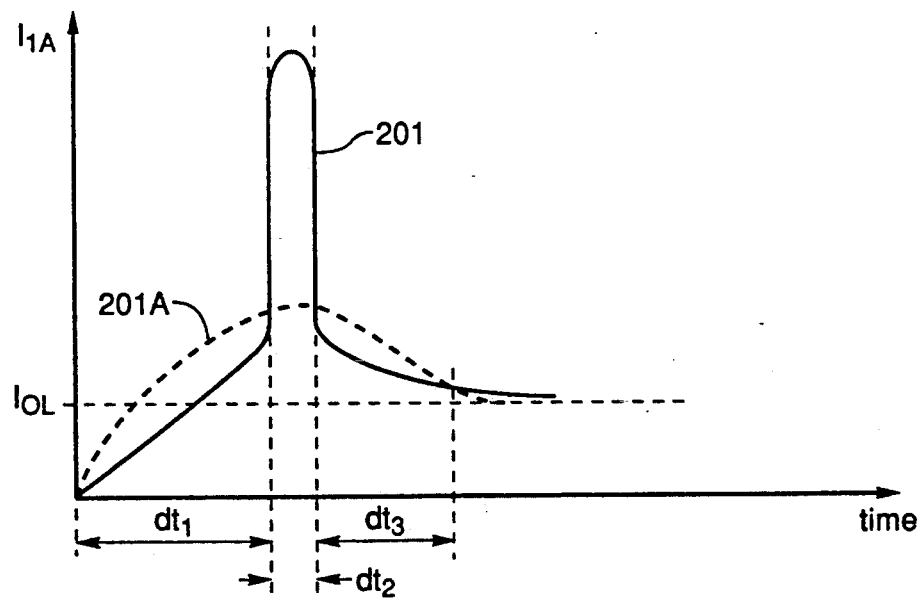
FIG. 7 is an output current response curve of the present invention superimposed on an output current response curve of prior art output buffers.

Referring to FIG. 8, because there is no abrupt switching of the output sink current I1A from the load 250A through the package leads 260A and 270A, as shown by the curve in FIG. 7 numbered 201A, the noise voltage $V_N$ is minimal and the output voltage at node 201A is pulled down to the $V_{OL}$ level faster than was possible in the prior art, as shown in FIG. 6 by the curve numbered 201A.

The slope of the output signal 201A (FIG. 6) may be verified by a tester that is connected to the output pad and then interactively readjusted to a desired slope rate by reprogramming said dedicated programmable inputs E2-E7 (FIG. 4).

By programming the shape and slope of the output signals, the present invention allows a fast output switching delay to be programmed for use with a low inductance package such as a PLCC for delay reduction, and a slow output switching delay is allowed to be programmed for use with a high inductance package such as a DIP for ground noise reduction. The preferred embodiments of the invention have now been described. Various substitutions and alternatives will be apparent to persons skilled in the art from the above description. It is therefor not intended that the invention be limited to the described embodiments, but only as defined by the appended claims.

What is claimed is:

1. A programmable output buffer for an integrated circuit having improved noise reduction as a result of sink current from the load into the integrated circuit comprising:
   a pull-up circuit;
   a pull-down circuit;
   said pull-up circuit and said pull-down circuit having a common input line and a common output line;
   a programmable and fully-static fine current control means included in said pull-down circuit and connected between said common input line and said common output line;
   a programmable and fully-static coarse current control means included in said pull-down circuit and connected between said common input line and said common output line;
   whereby signal transitions on said common input line cause controllable transition on said common output line with controllable slope and shape.

2. The programmable output buffer of claim 1 where said fine current control means drives at least one output MOS transistor connected to said data output line, and said coarse current control means drives an output bipolar transistor connected to said common output line.

3. The programmable output buffer of claim 1 where said fine current control means includes at least one programmable input that retains its logical state by means of a storage cell element.

4. The programmable output buffer of claim 1 where said fine current control means comprising:
   a first fully-static delay generator means having a) a first input connected to said data input line, b) a first output connected to a second fully-static delay generator means, c) a second output connected to said second delay generator means and to a first MOS transistor that is connected to said data output line; and
   said second delay generator means having a) a second input connected to said first output, b) a third output connected to a second MOS transistor that is connected to said data output line, and said third output is also connected to an input of said coarse current control means.

5. The programmable output buffer of claim 4 where said fine current control means further includes at least one programmable input that determines the length of delay through said first and said second delay generator means.

6. The programmable output buffer of claim 5 where said programmable input controls the current between a power rail and said first and said second delay means.

7. The programmable output buffer of claim 6 where said current flow through MOS transistors whose gates are connected to said programmable inputs.

8. The programmable output buffer of claim 1 where said coarse current control means comprises:
   a darlington circuit with a bipolar transistor connected to an output of a logic gate;
   a first input connected to a first input of said logic gate;

a second input connected to a second input of said logic gate;

a third input connected to said common input line and to the base of said bipolar transistor of said darlington circuit; and a first output connected to the output node of said bipolar transistor.

9. The programmable output buffer of claim 8 where said logic gate includes a first input connected to a programmable storage element and a second input connected to an output of said fine current control means.

10. The programmable output buffer of claim 1 where said coarse current control means includes at least one programmable input that retains its logical state by means of a storage cell element.

11. The programmable output buffer of claim 8 where said coarse current control means further includes at least one programmable input that determines the value of the maximum current flow through said bipolar transistor.

* * * * *